(12) United States Patent
Levy et al.

(10) Patent No.: US 9,812,566 B1
(45) Date of Patent: Nov. 7, 2017

(54) LDMOS DEVICE HAVING A LOW ANGLE SLOPED OXIDE

(71) Applicant: Tower Semiconductor Ltd., Midgal Haemek (IL)

(72) Inventors: Sagy Levy, Zichron-Yaakov (IL); Sharon Levin, Haifa (IL); David Mistele, Haifa (IL)

(73) Assignee: TOWER SEMICONDUCTORS LTD., Migdal Haemeq (IL)

( * ) Notice: Subject to any disclaimer, the term of this patent is extended or adjusted under 35 U.S.C. 154(b) by 0 days.

(21) Appl. No.: 15/201,460

(22) Filed: Jul. 3, 2016

(51) Int. Cl.
*H01L 29/00* (2006.01)
*H01L 29/78* (2006.01)
*H01L 29/66* (2006.01)
*H01L 29/10* (2006.01)
*H01L 29/08* (2006.01)
*H01L 21/265* (2006.01)

(52) U.S. Cl.
CPC .... *H01L 29/7816* (2013.01); *H01L 21/26566* (2013.01); *H01L 29/0882* (2013.01); *H01L 29/1095* (2013.01); *H01L 29/66681* (2013.01)

(58) Field of Classification Search
CPC .................................................. H01L 29/7816
See application file for complete search history.

(56) References Cited

U.S. PATENT DOCUMENTS

| 6,423,598 B1* | 7/2002 | Takahashi | H01L 29/402 257/109 |
| 2001/0015458 A1* | 8/2001 | Itoh | H01L 29/0696 257/335 |

\* cited by examiner

*Primary Examiner* — William Harriston
(74) *Attorney, Agent, or Firm* — Reches Patents (57) ABSTRACT

A laterally diffused metal oxide semiconductor (LDMOS) device that may include an oxide region that comprises a bottom surface; a drain that is positioned between a left drift region and a right drift region and below the bottom surface; wherein the oxide region further comprises a first sloped surface and a second sloped surface; wherein a first angle between the first sloped surface and the bottom surface does not exceed twenty degrees; and wherein a second angle between the second sloped surface and the bottom surface of the oxide region does not exceed twenty degrees.

18 Claims, 8 Drawing Sheets

LDMOS DEVICE HAVING A LOW ANGLE SLOPED OXIDE

Laterally diffused metal oxide semiconductor (LDMOS) devices are used in high power applications.

There is a growing need to increase the voltage held by a LDMOS device without increasing the footprint of the LDMOS device.

SUMMARY

There are provided an integrated circuit that includes an LDMOS device, an LDMOS device and a manufacturing process, as illustrated in the claims.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

DETAILED DESCRIPTION OF THE DRAWINGS

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using devices and circuits known to those skilled in the art, details will not be explained in any greater extent than that considered necessary as illustrated above, for the understanding and appreciation of the underlying concepts of the present invention and in order not to obfuscate or distract from the teachings of the present invention.

In the following text BV means breakdown voltage and Rdson means drain to source resistance.

Figure 1A:
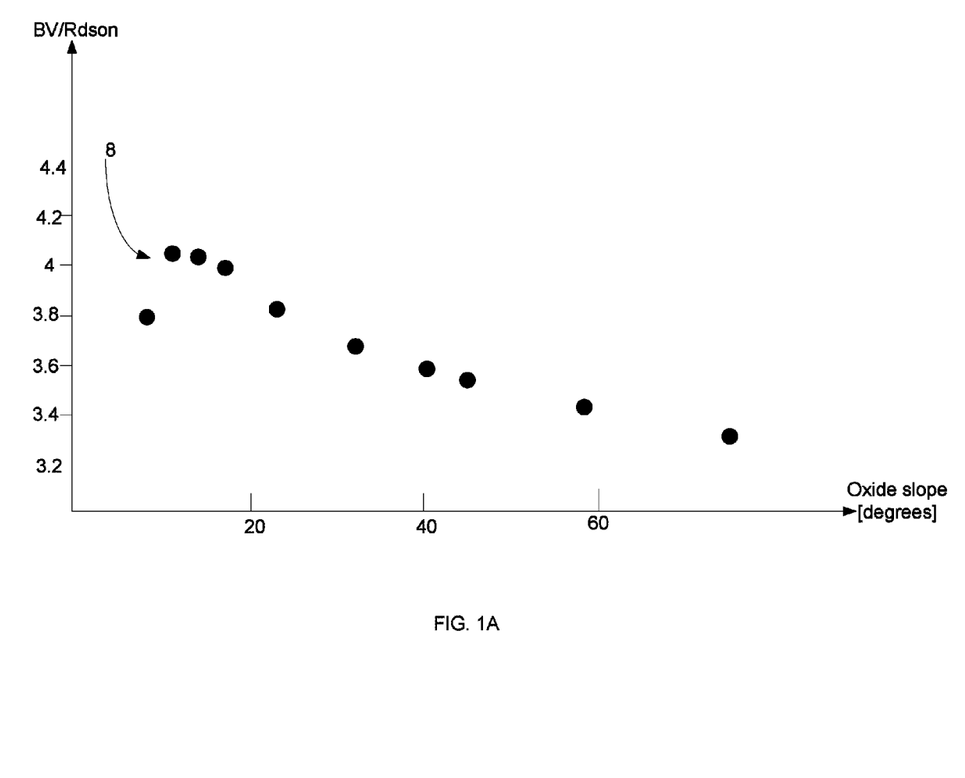
FIG. 1A illustrates the relationships between an oxide region slope and a breakdown voltage to drain to source resistance ratio according to an embodiment of the invention.

FIG. 1A illustrates the relationships between an oxide region slope and BV/Rdson according to an embodiment of the invention. It is desired to have a large BV/Rdson as possible.

FIG. 1A includes multiple circles 8 that represent the values of BV/Rdson for different slopes of the oxide region. FIG. 1A illustrates that BV/Rdson peaks at an oxide region slope of about fourteen degrees and that after the peak the BV/Rdson decreases with an increase of the oxide region slope.

Figure 1B:
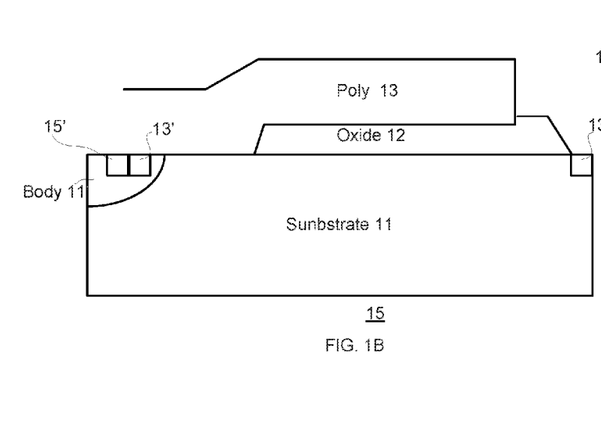
FIG. 1B is a cross sectional view of a portion of a prior art LDMOS device having an oxide region has a seventy eight degree slope.

FIG. 1B is a cross sectional view of prior art portion 15 of a prior art LDMOS device that has a seventy eight degrees sloped oxide.

Prior art portion 15 includes substrate 11, body 11', two N+ regions 13', P region 15', oxide region 12 (with an angle of seventy eight degrees) and a polysilicon region (poly) 13. FIG. 1B does not show the drift region formed within the substrate 11 for convenience of explanation.

Figure 1C:
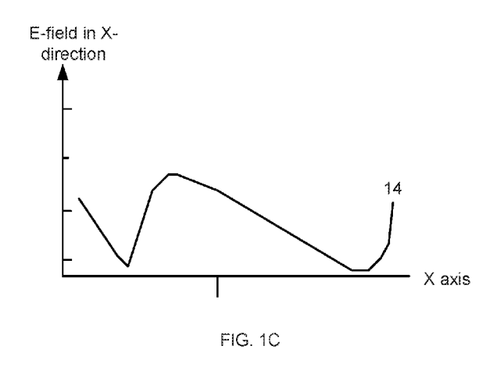
FIG. 1C illustrates the electrical field developed over the prior art LDMOS device of FIG. 1B.

FIG. 1C illustrates the electrical field (curve 14) formed along prior art portion 15.

Figure 1D:
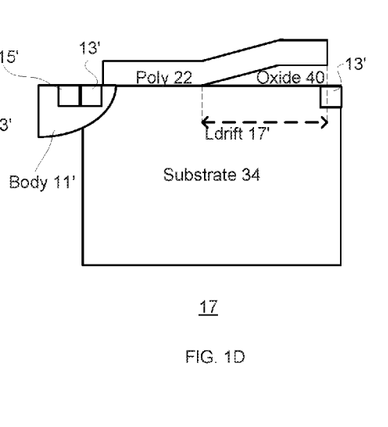
FIG. 1D is a cross sectional view of a portion of an LDMOS device having an oxide region having a slope of fourteen degrees according to an embodiment of the invention.

FIG. 1D is a cross sectional view of portion 17 of an LDMOS device according to an embodiment of the invention.

Portion 17 has a substrate 34, body 11', two N+ regions 13', P region 15', poly 22 and an oxide region 40 that has a slope of fourteen degrees. FIG. 1D does not show the drift regions formed within the substrate 34 for convenience of explanation but illustrates the length Ldrift 17' of the drift region.

Figure 1E:
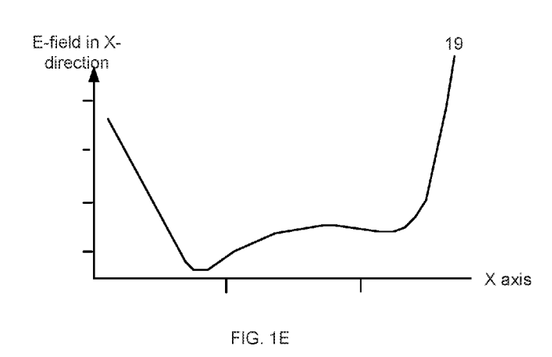
FIG. 1E illustrates the electrical field developed over the LDMOS device of FIG. 1D according to an embodiment of the invention.

FIG. 1E illustrates the X-axis electrical field (curve 19) formed along portion 17 of FIG. 1D.

FIGS. 1C and 1E illustrate that portion 17 can withstand much higher voltages than the prior art portion 15. This is illustrated by having a larger area below curve 14 in comparison to the area below curve 19.

In the prior art portion 15 there was a single oxide region 12 per drift region. Each drift region should be maintained small (for example—between 0.5-1.5 microns) thereby forcing the sidewalls of the oxide region to be substantially vertical.

According to an embodiment of the invention a pair of spaced apart drift regions (that are separated from each other by a shared drain) may share a single oxide region thereby increasing the length of the oxide region and allowing the sidewalls of the oxide region to be less oriented in relation to the substrate.

FIGS. 2A-2I are cross sectional views of an LDMOS device after the completion of various manufacturing processes.

Figure 2A:
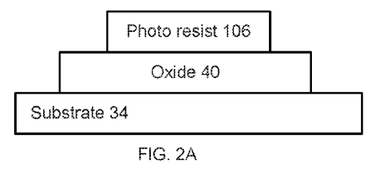
FIG. 2A-2I illustrate various manufacturing processes according to an embodiment of the invention.

FIG. 2A illustrates a rectangular shaped oxide layer 40' that is positioned between a first photoresist 106 and substrate 34.

Figure 2B:
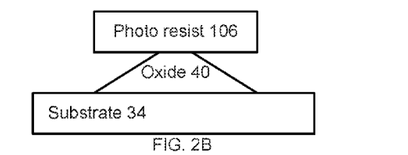

The LDMOS device of FIG. 2B is formed by etching the oxide layer to provide a trapezoid shaped oxide region (hereinafter oxide region) 40 that has a low slope. Two drift regions and a drain region will be eventually formed below oxide region 40.

Figure 2C:
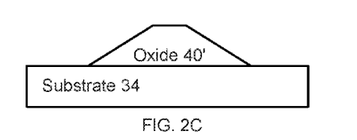

The LDMOS device of FIG. 2C is formed by removing the first photoresist and exposing the oxide region 40.

Figure 2D:
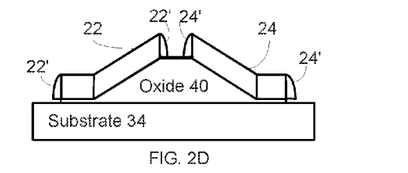

The LDMOS device of FIG. 2D is formed by growing gate oxide, depositing polysilicon electrodes (the horizontal lower parts of poly 22 and poly 24) and depositing sloped contacts electrode (polysilicon gates—poly 24 and poly 22) on first and second sloped surfaces of the oxide region 40.

Figure 2E:
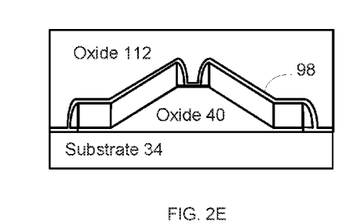

The LDMOS device of FIG. 2E is formed by depositing a separation layer 98 on top of the substrate 34, on top of oxide region 40, on top of poly 22 and on top of poly 24, and by depositing an additional oxide region (oxide 112) on the separation layer 98. Silicon Nitride spacers 22' and 24' are deposited and etched at the opposite edges of poly 22 and of poly 24.

Figure 2F:
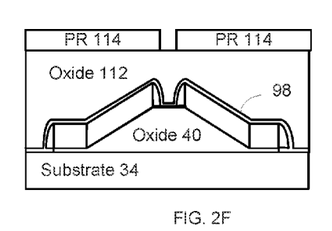

The LDMOS device of FIG. 2F is formed by depositing a second photoresist (PR) 114 on top of the additional oxide region. The second photoresist 114 may have an aperture that will later define the shape of a trench. It should be noted that this involves using a shared mask with all contacts.

Figure 2G:
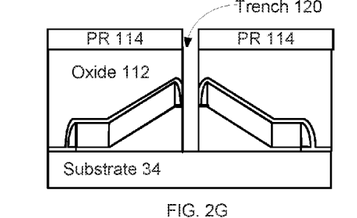

The LDMOS device of FIG. 2G is formed by:
a. Forming trench 120. The shape of the trench 120 is defined by the aperture of the second photoresist 114. The trench 120 is elongated along a longitudinal axis (not shown) that is vertical to the plane of FIGS. 1A-1J. The trench may be deep and narrow. The trench may be formed during a step that forms non-trench contacts. See, for example, FIGS. 4A and 4B.
b. Removing the second photoresist 114.

It should be noted that the LDMOS device may belong to an integrated circuit that includes non-LDMOS devices such as CMOS transistors or other non-LDMOS transistors. These non-LDMOS devices should not be affected by a selective implant process that is mentioned below (see, for example, FIGS. 3A, 3B, 4A and 4B). A non-LDMOS device may include a contact opening that may expose a small part of the substrate. The contact opening has a high enough aspect ratio that will prevent the selective implant process to affect the substrate exposed by the contact opening.

Figure 2H:
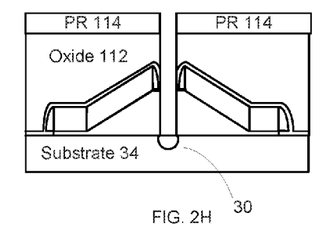

The LDMOS device of FIG. 2H is formed by:
a. Performing a selective implant process for implanting dopants within a part of the substrate (exposed by trench 120) that will become a drain.
b. Performing a spike anneal (such as but not limited to RTA anneal spike or regular RTA or other thermal anneal) is used to activate the dopants thereby completing the formation of drain 30 within the substrate.

Figure 2I:
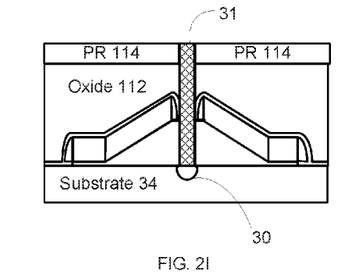

The LDMOS device of FIG. 2I is formed by filling trench 120 with a conductive material to form a drain contact 31.

According to an embodiment of the invention the formation (FIGS. 2A-2C) of the trapezoid shaped oxide region (above two drift regions and a drain), the formation of the elongated trench (FIGS. 2F and 2G) as well as the selective implant process and the spike anneal (FIGS. 2G and 2H) may be dedicated stages and are not included in standard CMOS manufacturing process stages. Other stages may or may not be affected by the outcome of these dedicated stages but may be implemented during the execution of standard CMOS manufacturing process steps.

Figure 3A:
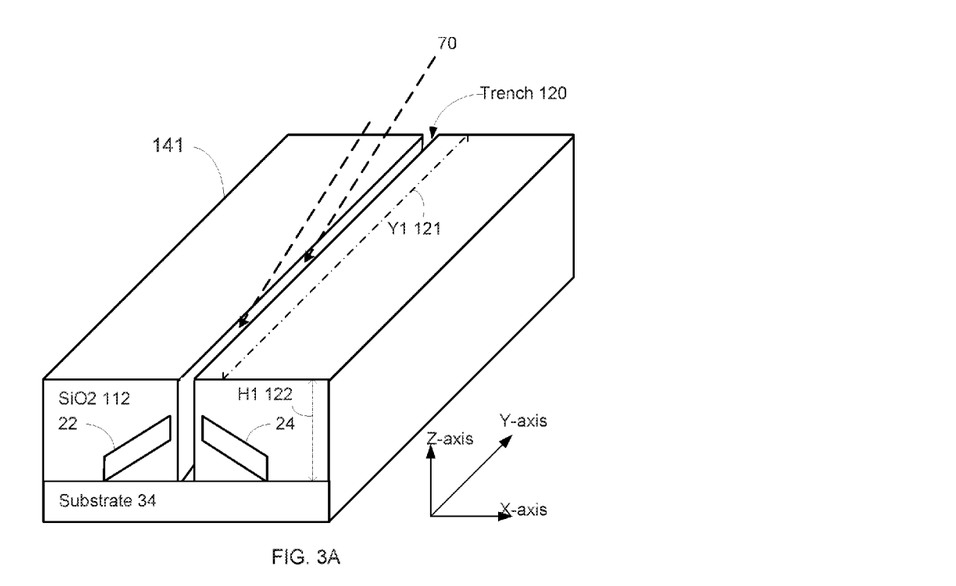
FIG. 3A-3B illustrate various portions of an integrated circuit during a manufacturing step according to an embodiment of the invention.
Figure 3B:
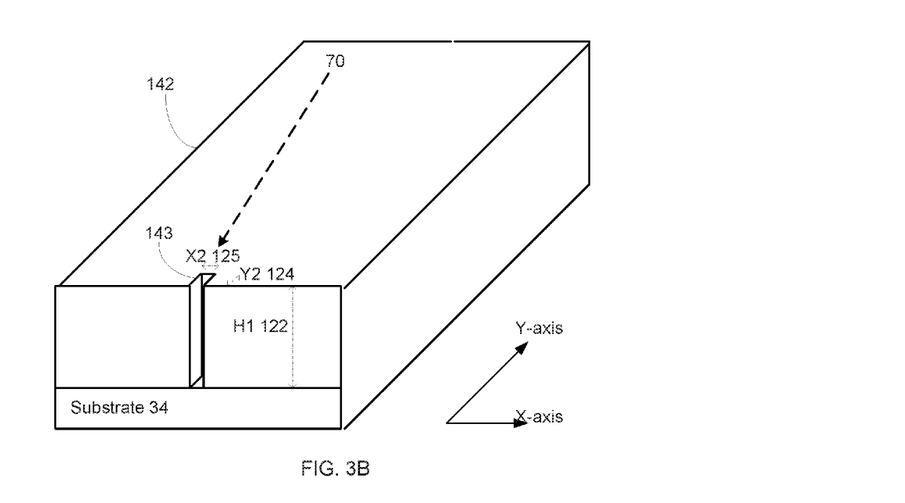
Figure 4A:
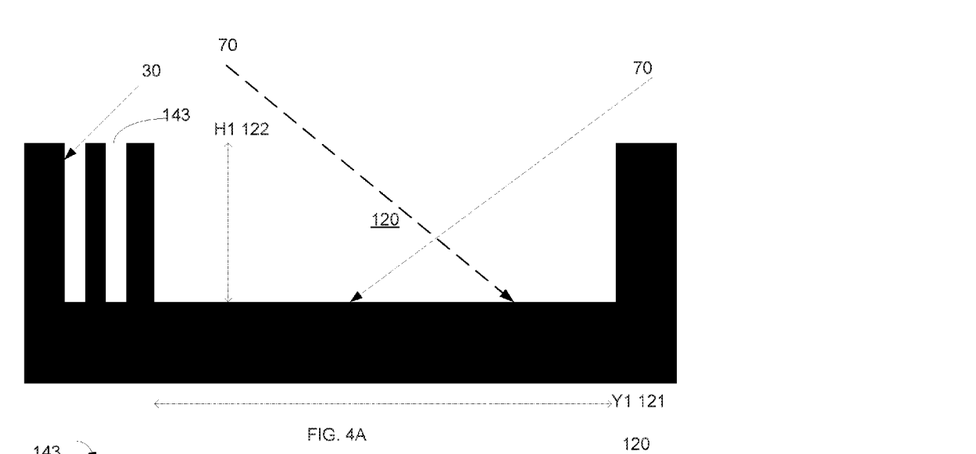
FIG. 4A is a cross sectional view of a portion of an integrated circuit during a manufacturing step according to an embodiment of the invention.

FIG. 3A illustrates a first portion 141 of an integrated circuit according to an embodiment of the invention. FIG. 3B illustrates a second portion 142 of the integrated circuit according to an embodiment of the invention. FIG. 4A and illustrates trenches 120 and contact openings 143 according to an embodiment of the invention.

First portion 141 includes substrate 34, trench 120, additional oxide 112 and poly 24 and 22 of an LDMOS device.

Second portion 142 includes contact opening 143 that has a small enough width and length (for example less than 0.22 by 0.22 microns).

The selective implant process is selective in the sense that the one or more ion beam 70 that irradiate the integrated circuit during the implant process may propagate through trench 120 and reach the substrate 34 at locations that are exposed by trench 120 while not reaching the substrate 34 at locations that are exposed by the contact opening 143.

The one or more ion beam 70 impinge on the first and second portion at a relatively low angle (for example between 10-80 degrees) so that the one or more ion beam 130 does not reach the bottom of contact opening 143.

The trench 120 has a length (along the Y axis) denoted Y1 121, and a height H1 122.

The contact opening 143 has a length (along the Y axis) denoted Y2 124, a width (along the X axis) denoted X2 152 and a height H1 122.

The angle of incidence of the one or more ion beam should not exceed arctangent (H1/Y1) and should well exceed each one of arctangent (H1/X2) and arctangent (H1/Y2).

The trench 120 may be illuminated by one or more ion beams 70 from two substantially opposite angles in order to reach the entire bottom part of the trench 120.

Figure 4B:
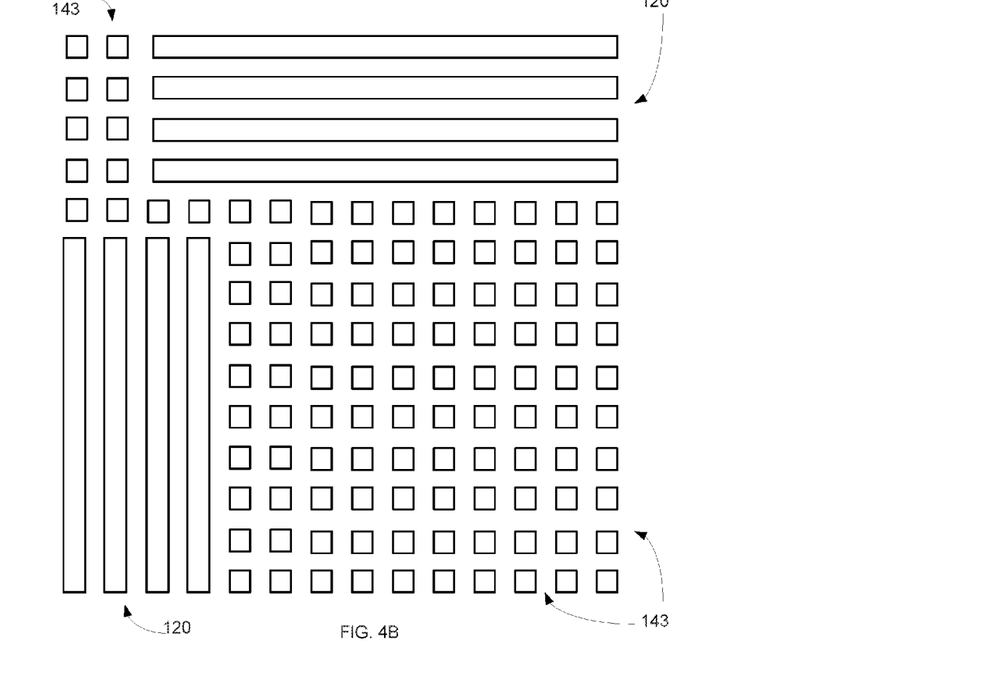
FIG. 4B is a cross sectional view of a portion of an integrated circuit during a manufacturing step according to an embodiment of the invention.

It is noted that different trenches of the integrated circuit may be oriented at different directions (for example along the X axis or along the Y axis—as illustrated in FIG. 4B) and the selective implant process should direct implant radiation along these different directions.

For example—the integrated circuit of FIG. 4B may be illuminated by one or more ion beams along four directions (zero degrees, ninety degrees, one hundred and eighty degrees and two hundred and seventy degrees).

Figure 5:
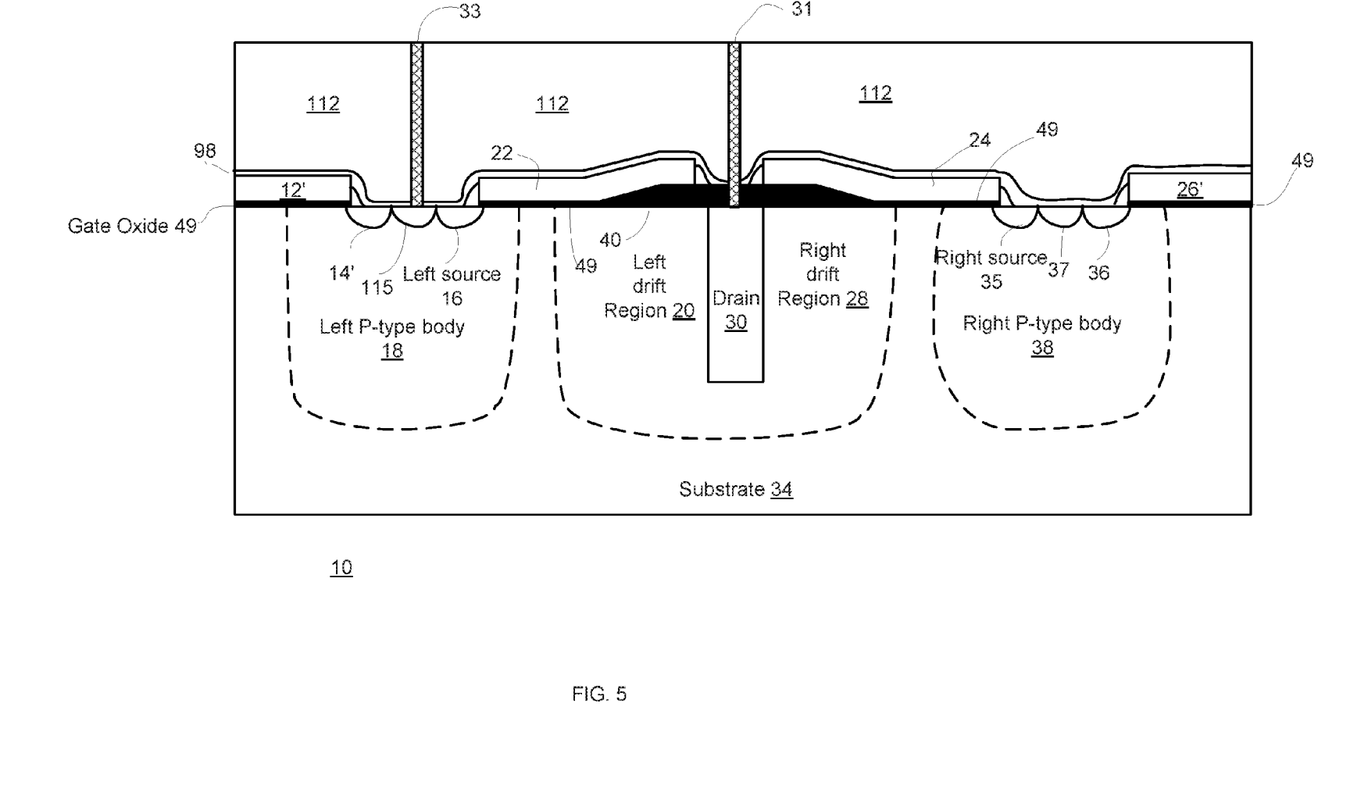
FIG. 5 is a cross sectional view of a LDMOS device having a low angle sloped oxide region according to an embodiment of the invention.
Figure 6:
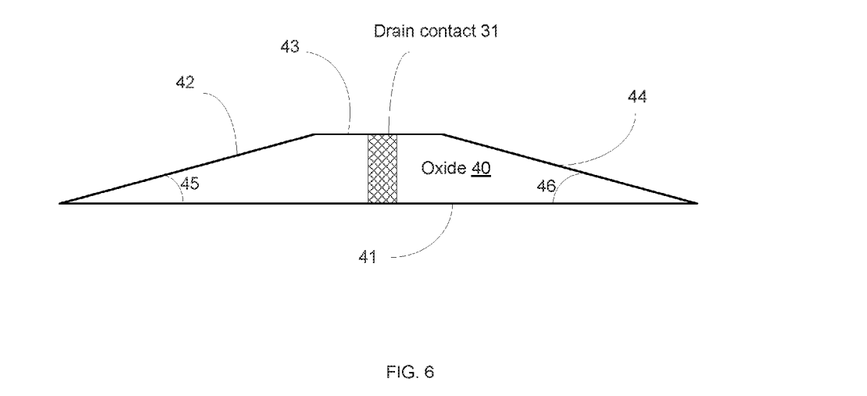
FIG. 6 is a cross sectional view of an oxide region according to an embodiment of the invention.

FIG. 5 is a cross sectional view of an LDMOS device 10 having a low angle sloped oxide according to an embodiment of the invention. FIG. 6 is a cross sectional view of an oxide region of the LDMOS device 10 according to an embodiment of the invention.

LDMOS device 10 includes:
 a. Oxide region 40. Oxide region 40 is segmented by drain contact 31. Oxide region 40 includes a bottom surface 41.
 b. Drain 30. Drain 30 is positioned between a left drift region 20 and right drift region 28 and below the bottom surface 41 (denoted FIG. 6 in FIG. 6). Drain is contacted by drain contact 31 and by the bottom surface 41.
 c. The oxide region 40 includes (see FIG. 6) a first sloped surface 42 and a second sloped surface 44. A first angle 46 between the first sloped surface 42 and the bottom surface 41 does not exceed twenty degrees. A second angle 45 between the second sloped surface 44 and the bottom surface 41 of the oxide region does not exceed twenty degrees. The oxide region 40 may also include a top region 43.

d. Left P-type body 18. The left P-type body 18 surrounds left source 16 and an additional left source 14.

e. Right P-type body 38. The right P-type body 38 surrounds right source 35 and an additional right source 36.

f. Left drift region 20. Left drift region 20 is positioned below oxide region 40, and between drain 30 and the left p-type body 18. Left drift region 20 is included in deep N well 29.

g. Right drift region 28. Right drift region 28 is positioned below oxide region 40, and between drain 30 and the right p-type body 38. Right drift region 28 is included in deep N well 29.

h. Left poly 22. The left poly 22 is a gate above the left P-type body 18 and is a field plate outside the left P-type body 18. Left poly 22 contacts (mechanically) left source 16. Left source 16 is surrounded by the left P-type body 18. Left poly 22 is positioned above and contacts first sloped surface 42. Left source 16 contacts Pbody tap 115 that in turn contacts another N region 14'.

i. Right poly 24. The right poly 24 is a gate above the right P-type body 38 and is a field plate outside the right P-type body 38. Right poly 24 contacts (mechanically) right source 35. Right source 35 is surrounded by the right P-type body 38. Right poly 24 is positioned above and contacts first sloped surface 42. Right source 35 contacts another Pbody tap 37 that in turn contacts yet another N region 36.

j. Additional oxide layer 112.

k. Contact 33 that is made of conductive material, and is formed within a contact opening (such as contact opening 143 of FIGS. 4A and 4B) within additional oxide layer 112. Contact 33 is connected to Pbody tap 115.

l. Drain contact 31 formed within a trench 120 that was previously formed within additional oxide layer 112. FIG. 5 illustrates that a single LDMOS device may be contacted by conductors formed within a trench 120 and within contact opening 143.

m. P-regions 12' and 26'. P region 12' contacts N region 14'. P region 26' contacts additional right source 36.

n. Gate oxide 49. Gate oxide 49 is positioned below each one of P region 12', poly 22, poly 24 and P-region 26'.

It should be noted that the selective implant process can be used to create a drain is deep and even very deep. Depths of about 0.55 micron were achieved by the selective implant process—which are much deeper than standard 0.18 micron deep drains. The deep drain reduces current crowding in the drain 30 to drain contact 31 interface and this further increases BV/Rdson and the Snap-Back voltage. The Snap-Back voltage may be replaced by breakdown in On state.

Deep drains may be useful in the LDMOS devices and may not be useful in other devices (such as regular CMOS transistors). The selective implant enables to form the deep drains only in the LDMOS devices.

Figure 7:
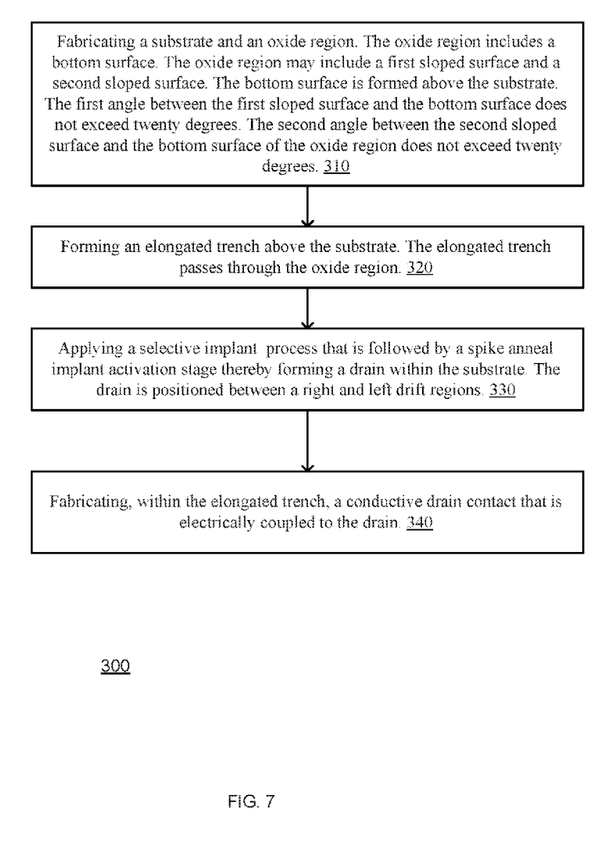
FIG. 7 illustrates a manufacturing method according to an embodiment of the invention.

FIG. 7 illustrates method 300 according to an embodiment of the invention.

Method 300 may include step 310 of fabricating a substrate and an oxide region. The wherein the oxide region includes a bottom surface. The oxide region may include a first sloped surface and a second sloped surface. The bottom surface is formed above the substrate. The first angle between the first sloped surface and the bottom surface may not exceed a threshold such as but not limited to twenty degrees. The second angle between the second sloped surface and the bottom surface of the oxide region does not exceed twenty degrees.

Step 310 may be followed by step 320 of forming an elongated trench above the substrate. The elongated trench is formed in the oxide region.

Step 320 may be followed by step 330 of applying a selective implant process that is followed by a spike anneal implant activation stage thereby forming a drain within the substrate. The drain is positioned between a right and left drift regions.

Step 330 may be followed by step 340 of fabricating, within the elongated trench, a conductive drain contact that is electrically coupled to the drain.

Method 300 may include additional steps.

The following list illustrates various manufacturing steps according to various embodiments of the invention:

Starting Material.
N+ Buried layer Photo/Implant (N+ stands for a doped N-type)
Epi deposition (epi stand for epitaxial)
Sinker Photo/Implant
AA Photo/Etch (AA stands for active area)
Deep Nwell for Power—formed by Photo/Implant (Nwell stands for N type well)
WN (N well) Photo/Implant
WP (P well) Photo/Implant
a. Low angle step oxide and Photo/wet Etch (step 310).
GOX (Gate Oxidation)
Poly Silicon Gate Photo/Etch
LDMOS Body Photo/Implant
NLDD Photo/Implant
PLDD Photo/Implant
Spacer Deposition
SPE (Spacer Etch)
N S/D (N++ Source Drain) Photo/Implant (N++ stands for a highly doped N-type)
P S/D (P++ Source Drain) Photo/Implant (P++ stands for a highly doped P-type)
No Silicide depsotion Photo/Etch
Silicide reaction in silicon exposed area.
Dielectric 1 BEOL deposition
Contact Photo/Etch
B. Angle drain contact implant (step 330)
C. RTA or spike anneal implant angle activation (Step 330)
Ti/TiN Sputter
W tungsten fill
BEOL (M1, V2, M2 . . . )

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Any reference in the specification to terms comprising or including should be applied mutatis mutandis to the terms consisting and/or consisting essentially of.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A laterally diffused metal oxide semiconductor (LDMOS) device, comprising:
   an oxide region that comprises a bottom surface;
   a drain that is positioned between a left drift region and a right drift region and below the bottom surface;
   wherein the oxide region further comprises a first sloped surface and a second sloped surface;
   wherein a first angle between the first sloped surface and the bottom surface does not exceed twenty degrees;
   wherein a second angle between the second sloped surface and the bottom surface of the oxide region does not exceed twenty degrees;
   wherein the LDMOS device is manufactured by a method of manufacturing that comprises:
   fabricating a substrate and the oxide region;
   forming an elongated trench above the substrate; wherein the elongated trench passes through the oxide region;
   applying a selective implant process that is followed by a spike anneal implant activation stage thereby forming a drain within the substrate; wherein the drain is positioned between a right and left drift regions; and
   fabricating, within the elongated trench, a conductive drain contact that is electrically coupled to the drain.

2. The LDMOS device according to claim 1 wherein each one of the first and second angles does not exceed fifteen degrees.

3. The LDMOS device according to claim 1 wherein each one of the first and second angles does not exceed ten degrees.

4. The LDMOS device according to claim 1 wherein the first sloped surface contacts a left polysilicon region; wherein the left polysilicon region contacts a left source; wherein the second sloped surface contacts a right polysilicon region; wherein the right polysilicon region contacts a right source; wherein the right source is surrounded by a right body region; wherein the left source is surrounded by a left body region.

5. The LDMOS device according to claim 1 wherein a depth of the drain exceeds one fifth of a micron.

6. The LDMOS device according to claim 1 wherein a depth of the drain exceeds one half of a micron.

7. The LDMOS device according to claim 1 comprising a conductive drain contact that contacts an upper part of the drain.

8. The LDMOS device according to claim 1 comprising a conductive drain contact that passes though the oxide region.

9. A method for manufacturing a laterally diffused metal oxide semiconductor (LDMOS) device, the method comprises:
   fabricating a substrate and an oxide region; wherein the oxide region comprises a bottom surface; wherein the oxide region further comprises a first sloped surface and a second sloped surface; wherein the bottom surface is formed above the substrate; wherein a first angle between the first sloped surface and the bottom surface does not exceed twenty degrees; and wherein a second angle between the second sloped surface and the bottom surface of the oxide region does not exceed twenty degrees;
   forming an elongated trench above the substrate; wherein the elongated trench passes through the oxide region;

applying a selective implant process that is followed by a spike anneal implant activation stage thereby forming a drain within the substrate; wherein the drain is positioned between a right and left drift regions; and fabricating, within the elongated trench, a conductive drain contact that is electrically coupled to the drain.

10. The method according to claim 9 wherein the applying of the selective implant process comprises illuminating an integrated circuit that comprises the LDMOS device with one or more ion beams.

11. The method according to claim 10 wherein the integrated circuit comprises contact openings that are formed above the substrate at locations that belong to circuits that differ from the LDMOS device; wherein the contact openings are smaller than the elongated trench; and wherein the applying of the selective implant process comprises illuminating the elongated trench and the contact openings with one or more ion beams that are directed at an incidence angle that causes the one or more ion beams to impinge on the substrate at locations that are exposed by the elongated trench and not impinge on the substrate at locations that are exposed by the contact openings.

12. The method according to claim 9 wherein each one of the first and second angles does not exceed fifteen degrees.

13. The method according to claim 9 wherein each one of the first and second angles does not exceed ten degrees.

14. The method according to claim 9 wherein the first sloped surface contacts a left polysilicon region; wherein the left polysilicon region contacts a left source; wherein the second sloped surface contacts a right polysilicon region; wherein the right polysilicon region contacts a right source; wherein the right source is surrounded by a right body region; wherein the left source is surrounded by a left body region.

15. The method according to claim 9 wherein a depth of the drain exceeds one fifth of a micron.

16. The method according to claim 9 wherein a depth of the drain exceeds one half of a micron.

17. The method according to claim 9 comprising a conductive drain contact that contacts an upper part of the drain.

18. The method according to claim 9 comprising a conductive drain contact that passes though the oxide region.

\* \* \* \* \*